(12) United States Patent
Watanabe et al.

(10) Patent No.: US 6,580,113 B2
(45) Date of Patent: *Jun. 17, 2003

(54) SEMICONDUCTOR DEVICE AND MANUFACTURING METHOD THEREOF

(75) Inventors: Shinya Watanabe, Tokyo (JP); Shunji Yasumura, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,394

(22) Filed: Jun. 28, 1999

(65) Prior Publication Data

US 2001/0040251 A1 Nov. 15, 2001

(30) Foreign Application Priority Data

Jan. 18, 1999 (JP) .......................................... 11-009632

(51) Int. Cl.[7] .............................................. H01L 29/94
(52) U.S. Cl. ...................... 257/309; 257/306; 257/308; 257/307
(58) Field of Search ................................ 257/303, 758, 257/301, 306, 508, 307, 309, 308; 438/387, 244, 618, 398

(56) References Cited

U.S. PATENT DOCUMENTS

| | | | | | |
|---|---|---|---|---|---|
| 5,077,688 A | * | 12/1991 | Kumanoya et al. | .......... | 365/149 |
| 5,110,752 A | * | 5/1992 | Lu | .............. | 437/47 |
| 5,278,091 A | * | 1/1994 | Fazan et al. | ............ | 437/52 |
| 5,315,140 A | * | 5/1994 | Sugahara et al. | .......... | 257/306 |
| 5,323,343 A | * | 6/1994 | Ogoh et al. | ............ | 365/149 |
| 5,352,913 A | * | 10/1994 | Chung et al. | ............ | 257/301 |
| 5,381,365 A | * | 1/1995 | Ajika et al. | ............ | 365/149 |
| 5,406,102 A | * | 4/1995 | Oashi | .............. | 257/296 |
| 5,447,878 A | * | 9/1995 | Park et al. | ............ | 437/52 |
| 5,449,636 A | * | 9/1995 | Park et al. | ............ | 437/52 |
| 5,608,241 A | * | 3/1997 | Shibuya et al. | .......... | 257/207 |
| 5,612,558 A | * | 3/1997 | Harshfield | ............ | 257/298 |
| 5,629,223 A | * | 5/1997 | Thakur | ............ | 438/398 |
| 5,696,014 A | * | 12/1997 | Figura | ............ | 437/52 |
| 5,726,459 A | * | 3/1998 | Hsu et al. | ............ | 257/55 |
| 5,920,124 A | * | 7/1999 | Kimura | ............ | 257/774 |
| 6,054,385 A | * | 4/2000 | Gardner et al. | .......... | 438/655 |

(List continued on next page.)

FOREIGN PATENT DOCUMENTS

JP 7-29994 1/1995

OTHER PUBLICATIONS

H. Watanabe et al. A New Cylindrical Capacitor Using Hemispherical Grained SI (HSG–SI) for 256Mb DRAMs. 1992 IEEE pp. 10.1.1–10.1.4.*

*Primary Examiner*—Steven Loke
*Assistant Examiner*—Douglas W. Owens
(74) *Attorney, Agent, or Firm*—McDermott, Will & Emery

(57) ABSTRACT

There is described a high-integration, superior-power-efficiency semiconductor device having a storage node, whose structure is suitable for enabling high-yield and inexpensive manufacture. A plurality of transfer gates are formed on a silicon substrate. An interlayer film is provided so as to cover the transfer gates. A hollow node is formed from conductive material on the interlayer film. A contact hole is formed so as to penetrate through the interlayer film without exposing the transfer gate, as well as to expose the surface of the silicon substrate within the hollow node. A conductive layer is formed so as to cover the interior surface of the contact hole to a predetermined thickness in the region ranging from the interior surface of the hollow node to the exposed portion of the silicon substrate.

8 Claims, 15 Drawing Sheets

U.S. PATENT DOCUMENTS

| | | | | |
|---|---|---|---|---|
| 6,078,492 | A | * | 6/2000 | Huang et al. ............. 361/301.4 |
| 6,160,285 | A | * | 12/2000 | Schugraf et al. ............. 257/309 |
| 6,160,713 | A | * | 12/2000 | Floyd et al. ................. 361/760 |
| 6,163,046 | A | * | 12/2000 | Okumura et al. ........... 257/306 |
| 6,177,328 | B1 | * | 1/2001 | Liu et al. .................... 438/398 |
| 6,194,757 | B1 | * | 2/2001 | Shinkawata ................. 257/306 |
| 6,197,653 | B1 | * | 3/2001 | Khamankar et al. ........ 438/398 |
| 6,207,987 | B1 | * | 3/2001 | Tottori ........................ 257/306 |
| 6,211,033 | B1 | * | 4/2001 | Sandhu et al. .............. 438/387 |
| 6,235,605 | B1 | * | 5/2001 | Ping ........................... 438/398 |
| 6,331,725 | B1 | * | 12/2001 | Dennison .................... 257/368 |

\* cited by examiner

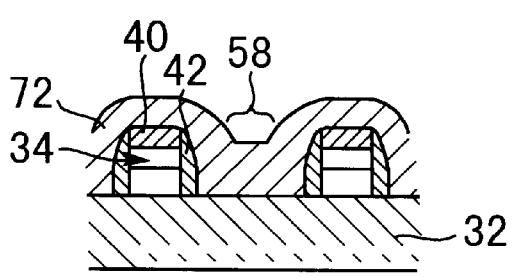 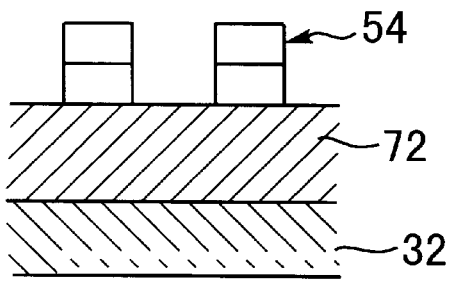
FIG. 15A  FIG. 15B
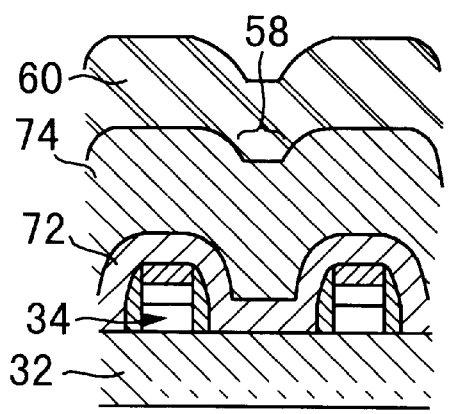 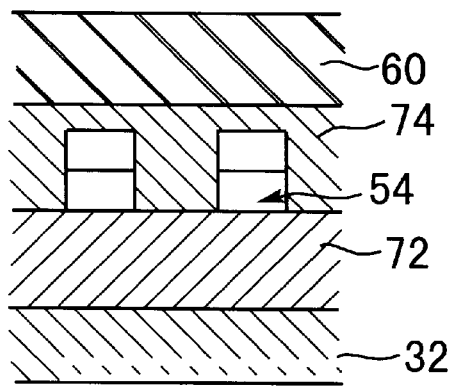
FIG. 16A  FIG. 16B

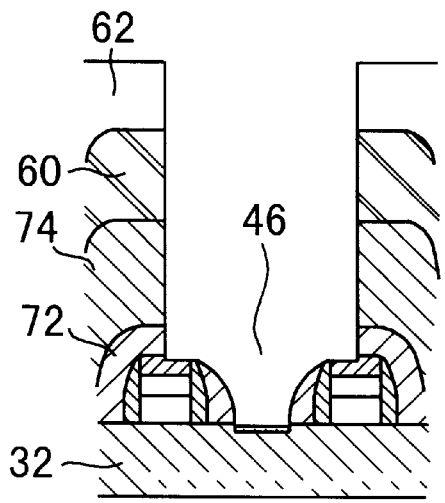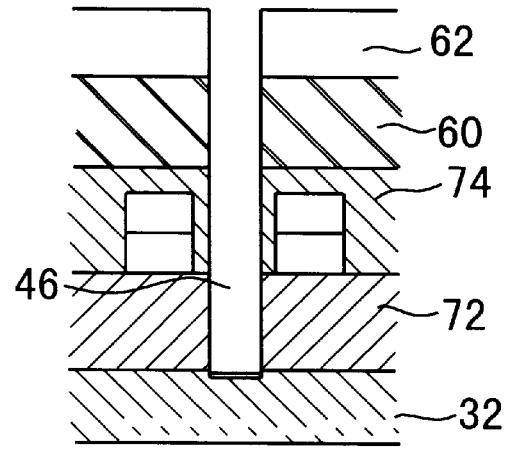
FIG. 19A  FIG. 19B
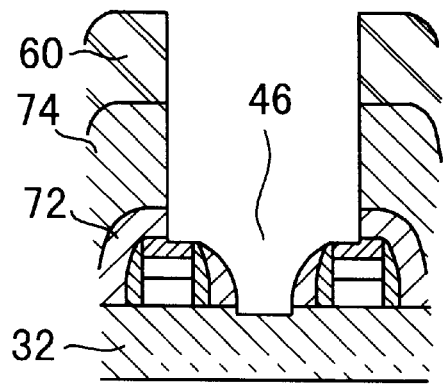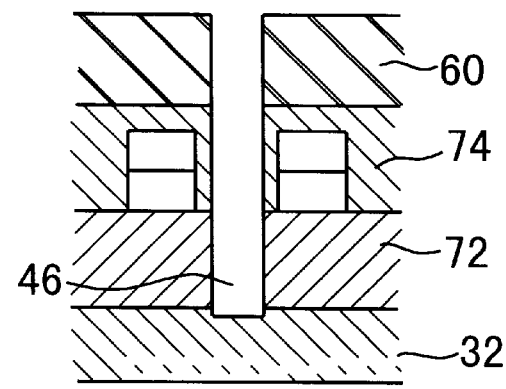
FIG. 20A  FIG. 20B

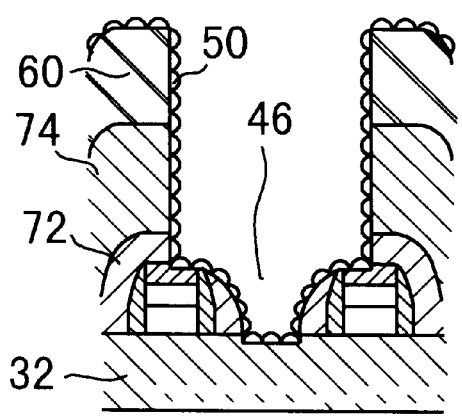 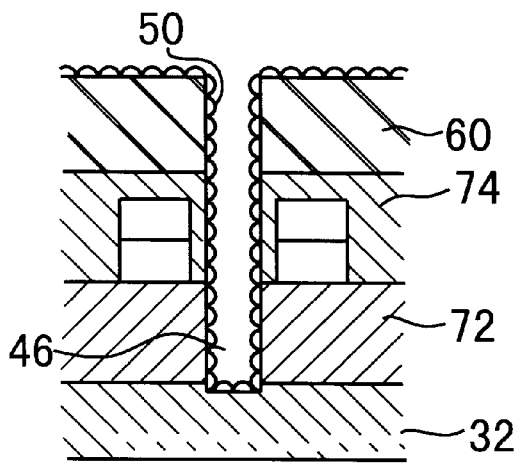
FIG. 21A          FIG. 21B
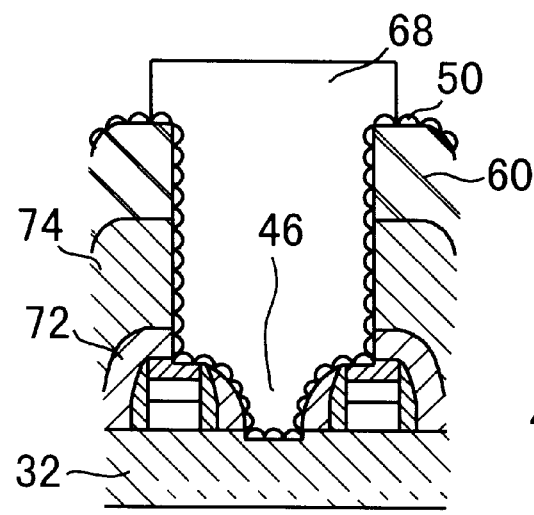 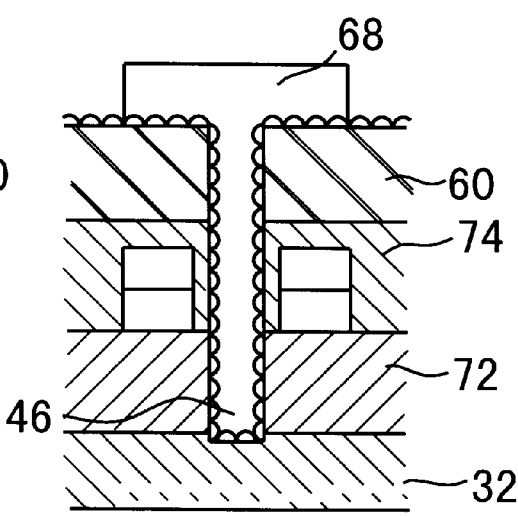
FIG. 22A          FIG. 22B

RELATED ART

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device having a storage node and to a manufacturing method of such a semiconductor device.

2. Description of the Background Art

FIG. 24 is a cross-sectional view showing a former semiconductor device 10. FIG. 25 is a top perspective view showing the structure of the semiconductor device 10.

As shown in FIG. 24, the semiconductor device 10 comprises a plurality of bit lines 12. The bit lines 12 are covered with a tetra-ethyl-ortho-silicate (TEOS) film 14, which is covered with a SiN film 16.

The semiconductor device 10 is also provided with a plurality of storage node contacts (hereinafter abbreviated as "SC") 18 each of which penetrates through the TEOS film 14 and the SiN film 16, and a plurality of storage nodes 20 each of which is in contact with the SC 18 and is provided on the TEOS film 14. The SC 18 and the storage node 20 are formed from doped polysilicon. A cell plate and an electrode layer (neither of which is shown in FIG. 24) are formed on the storage node 20 from a dielectric material and a conductive material, respectively. Together with the cell plate and the electrode layer, the storage node 20 acts as a capacitor for storing electric charge.

In FIG. 25, the semiconductor device 10 is described so that the bit lines 12 extend in a lateral direction. As shown in FIG. 25, a plurality of active regions 22 separated from one another by an isolation oxide film are formed on the silicon substrate of the semiconductor device 10. A plurality of transfer gates 24 are formed on the active regions 22 so as to extend perpendicular to the bit lines 12. On both sides of each of the transfer gates 24 are provided wiring frames 26 formed from a silicon oxide film. The transfer gates 24 and the bit lines 12 are insulated from each other by an interlayer film which is provided between thereof.

The area of the active region 22 that is positioned beneath the transfer gate 24 acts as a channel region of a transistor, and the areas of the active region 22 that are positioned on opposite sides of the channel region act as the source/drain regions of the transistor. Each of the source/drain regions is connected to a storage node 20 or a bit line 12 by way of the SC 18 or a bit line contact (hereinafter abbreviated as "BC")

In the former semiconductor device 10, the SC 18 must not interfere with or form a short circuit with the bit line 12. Further, in the former semiconductor device 10, the SC 18 must be formed so as to penetrate through a plurality of layers interposed between the active region 22 and the storage node 20 of the silicon substrate, i.e., a plurality of interlayer films containing the transfer gate 24 and the bit line 12. To form DRAM of the order of 64 megabits into the aforementioned structure, the SC 18 must be formed so as to assume a diameter of about 0.1 $\mu$m and a length of about 1 $\mu$m.

In order to form the SC 18 to a diameter of about 0.1 $\mu$m during the process of manufacturing the semiconductor device 10, photolithography for opening a contact hole for use as the SC 18 must be carried out through use of a high-precision manufacturing apparatus, i.e., a stepper which enables high-precision positioning. Further, forming such a contact hole requires a halftone mask which enables high-precision photolithography, as well as a processing for diminishing the diameter of the contact hole after opening thereof. For these reasons, inexpensive manufacture of high-integration DRAM based on the former DRAM structure has been difficult.

In the semiconductor device 10, contact resistance between the SC 18 and the active region 22 and contact resistance between the SC 18 and the storage node 20 become greater as the diameter of the SC 18 becomes narrower. In a DRAM structure in which the SC 18 is ensured of assuming only a diameter of about 0.1 $\mu$m, great electrical resistance is likely to arise between the storage node 20 and the active region 22. Therefore, by employing the former DRAM structure, it is difficult to realize a high-integration and power-efficient DRAM.

In the semiconductor device 10, in order to impart an enough capacity to each memory cell, it is necessary to ensure a sufficient surface area on the storage node 20. In the former structure, the surface area of the storage node 20 can be increased by increasing the height of the storage node 20. However, the higher the storage node 20, the more likely the storage node 20 is to fall. For this reason, when the former DRAM structure is employed, it is difficult to manufacture a high-integration DRAM at high-yield.

SUMMARY OF THE INVENTION

The present invention has been conceived to solve the previously-mentioned problems, and a general object of the present invention is to provide a novel and useful semiconductor device and a manufacturing method thereof.

A more specific object of the present invention is to provide a high-integration, highly-power-efficient semiconductor device which can be inexpensively manufactured at high yield.

The above object of the present invention is achieved by a semiconductor device described below. The semiconductor device includes a plurality of first wiring patterns formed on a silicon substrate. The first wiring patterns are covered with an interlayer film. On the interlayer film is provided a hollow node formed from conductive material. The semiconductor device also includes a contact hole which penetrates through the interlayer film without exposing the first wiring patterns and which exposes the surface of the silicon substrate within the hollow node. The interior surface of the hollow node, the interior surface of the contact hole, and the exposed portion of the silicon substrate are covered with a conductive layer.

A second object of the present invention is to provide a method of inexpensively manufacturing a high-integration, highly-power-efficient semiconductor device at high yield.

The above object of the present invention is achieved by a method of manufacturing a semiconductor device described below. The method includes the steps of forming a plurality of wiring patterns on a silicon substrate; forming an interlayer film so as to cover the first wiring patterns; depositing conductive material on the interlayer film; forming the interior surface of the hollow node by etching the conductive material; forming a contact hole in the hollow node so as to expose the surface of the silicon substrate, by etching the interlayer film so as not to expose the first wiring patterns; forming a conductive layer so as to cover the interior surface of the contact hole to a predetermined thickness, in the region ranging from the interior surface of the hollow node to the exposed portion of the silicon substrate; and forming the exterior surface of the hollow node by etching the conductive material.

Other objects and further features of the present invention will be apparent from the following detailed description when read in conjunction with the accompanying drawings.

BRIEF DESCRIPTION OF THE DRAWINGS

FIGS. 15A through 23B are cross-sectional views for describing a manufacturing method of the semiconductor device shown in FIG. 13;

DESCRIPTION OF THE PREFERRED EMBODIMENTS

Figure 1:
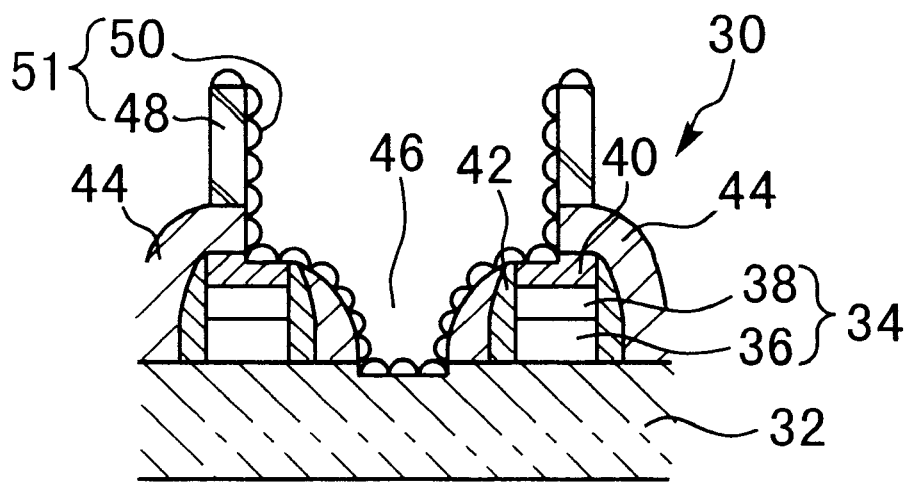
FIG. 1 is a cross-sectional view showing a semiconductor device according to a first embodiment of the present invention.

In the following, principles and embodiments of the present invention will be described with reference to the accompanying drawings. The members that are common to some of the drawings are given the same reference numerals and redundant descriptions therefor may be omitted.

First Embodiment

Figure 2:
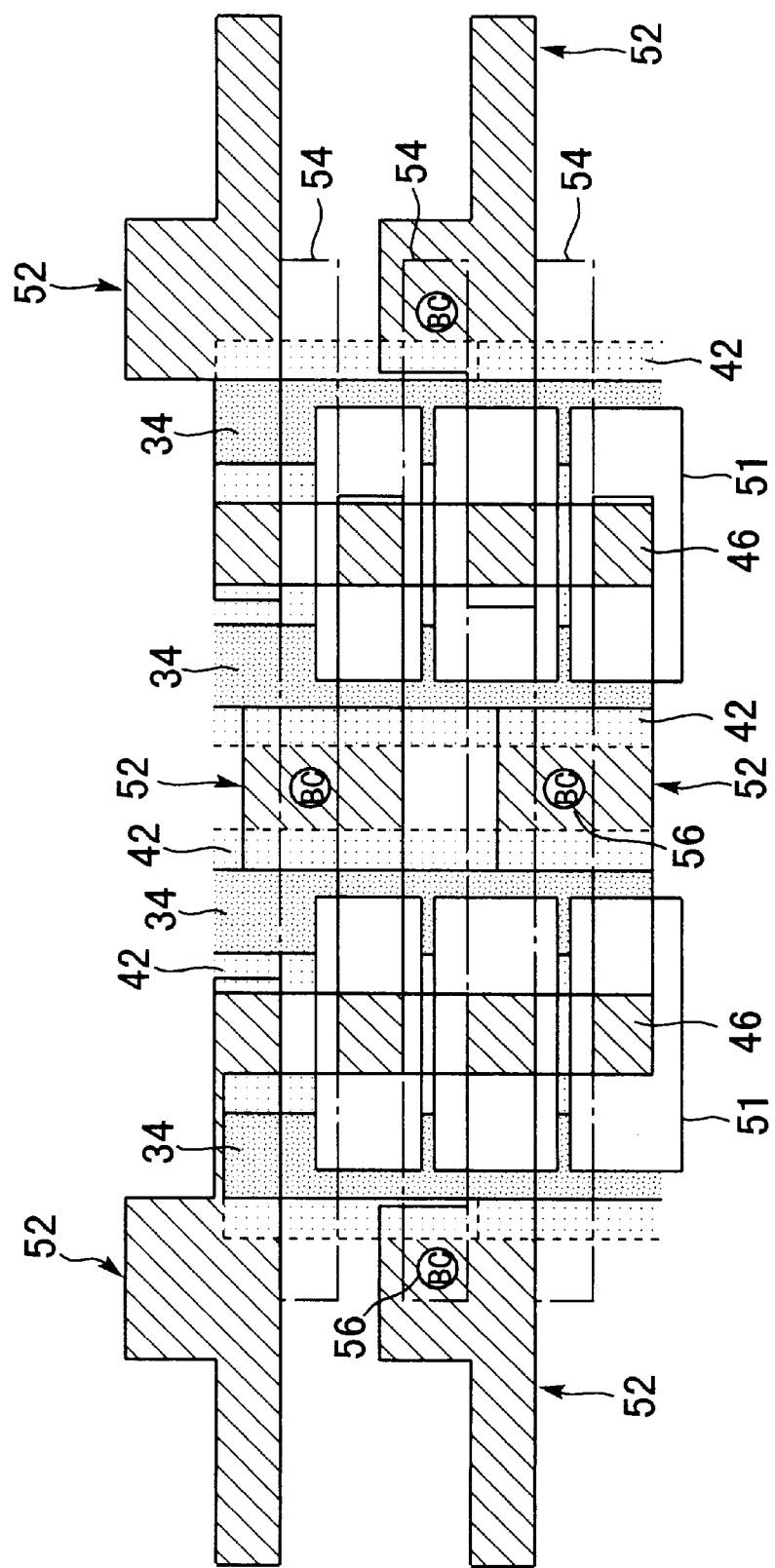
FIG. 2 is a perspective top view showing the structure of the semiconductor device shown in FIG. 1.

FIG. 1 is a cross-sectional view showing a semiconductor device 30 according to a first embodiment of the present invention, and FIG. 2 is a perspective top view showing the structure of the semiconductor device 30 according to the first embodiment.

As shown in FIG. 1, the semiconductor device 30 has a silicon substrate 32. On the silicon substrate 32 is formed a plurality of transfer gates 34 so as to extend parallel to one another. Each transfer gate 34 comprises a lower layer 36 formed from dopedpolysilicon and an upper layer 38 formed from tungsten silicide. The top surface of the transfer gate 34 is coated with an oxide film 40, and each side surface of the transfer gate 34 is coated with a wiring frame 42 formed from an oxide film.

The majority of the oxide film 40 and the majority of the wiring frame 42 covering the transfer gate 34 are covered with an interlayer film 44 formed from an oxide film (TEOS). A contact hole 46 is formed in the interlayer film 44 in such a way as to uncover a portion of the oxide film 40 and the wiring frames 42 covering the transfer gate 34 and to uncover the silicon substrate 32 at the location between two transfer gates adjoining each other.

A hollow node 48 is formed from doped polysilicon on the interlayer film 44 so as to surround the contact hole 46. The top and internal surfaces of the hollow node 48, the internal surface of the contact hole 46 (including the oxide film 42 and the exposed surface of the wiring frame), and the exposed surface of the silicon substrate 32 within the contact hole 46 are covered with a conductive layer 50 formed from doped polysilicon and having a predetermined degree of surface roughness.

The wall surface of the hollow node 48 and the conductive layer 50 (which will be hereinafter be collectively referred to as a "storage node 51") are covered with a cell plate (not shown) formed from a dielectric material. The cell plate is further covered with an electrode layer formed from a conductive material. Together with the cell plate and the electrode layer, the storage node 51 acts as a capacitor of the memory cell.

In FIG. 2, the semiconductor device 30 is described so that the transfer gates 34 extend in the vertical direction. As shown in FIG. 2, a plurality of active regions 52 separated from one another by an isolation oxide film are formed on the surface of the silicon substrate 32. The area of the active region 52 that is positioned below the transfer gate 24 acts as a channel region of the transistor. Further, the areas of the active region 52 that are positioned on both sides of the channel region act as source/drain regions of the transistor, respectively.

In the semiconductor device 30, a storage node 51 is formed so that the bottom of the contact hole 46 opens in the source/drain regions of the active region 52; in other words, the semiconductor device 30 is manufactured such that the bottom of the storage node 51 is electrically connected to the source/drain regions of the active region 52.

In the semiconductor device 30, a plurality of bit lines 54 perpendicular to the transfer gates 34 are formed on the storage node 51. Each bit line 54 is electrically connected to the source/drain region within the corresponding active region 52, more particularly to the source/drain region which is not electrically connected to the storage node 51, by way of a bit line contact (BC) 56. When the structure discussed above is provided, a memory cell is constituted of the storage node 51 and the transistor formed in the active region 52.

As mentioned previously, in the semiconductor device 30 according to the first embodiment, the bit lines 54 are formed on the storage node 51, thereby allowing the storage node 51 to be designed without consideration of interference with the bit lines 54. More specifically, the storage node 51 can be designed in consideration of only mutual interference between the storage nodes 51 and interference between the storage node 51 and the BC 52.

For these reasons, the storage node 51 of the semiconductor device 30 has a width greater than the pitch between the bit lines 54 in the direction perpendicular to the bit line 54 within the range in which no interference arises as shown in FIG. 2. Further, the storage node 51 has sufficient width in the direction parallel to the bit lines 54, within a range in which the storage node 51 does not interfere with the BC 56. More specifically, the storage node 51 assumes a width in the direction parallel to the bit lines 54, greater than half the pitch between transfer gates 34 but smaller than about 1.5 times the pitch of the same (more accurately, smaller than the sum of the gap between the transfer gates 34, the width of the two transfer gates 34, and the width of the two wiring frames 42).

In the semiconductor device 30, the bottom of the contact hole 46, i.e., the area where the storage node 51 is in contact with the active region 52, has a width substantially equal to the gap between bit lines 54 in the direction perpendicular to the same. Further, the bottom of the contact hole 46 has a width, in a direction parallel to the bit lines 54, which is about half the gap between the transfer gates 34.

As mentioned above, in the first embodiment, the storage node 51 and the bottom of the contact hole 46 have large cross-sectional areas.

If the storage node 51 has such a large cross-sectional area, high capacitance can be ensured without imparting the storage node 51 a great height. Further, the internal wall of the storage node 51 is roughened in the first embodiment. Thus, sufficient capacitance can be ensured while the height of the storage node 51 is sufficiently limited, even when high density is required. So long as the height of the storage node 51 can be limited, falling of the storage node 51 can be effectively prevented during the manufacturing process of the semiconductor device. Therefore, the semiconductor device 30 according to the present invention can be manufactured at high yield while having a high degree of integration.

In the case where the bottom of the contact hole 46 has such a large cross-sectional area as mentioned previously, only moderately high precision is required during the photolithography for forming the contact hole 46. Accordingly, the semiconductor device 30 can be inexpensively manufactured through use of an inexpensive manufacturing apparatus and an inexpensive mask. Further, when the bottom of the contact hole 46 has such a large cross-sectional area, electrical resistance between the active region 52 and the storage node 51 of the silicon substrate 32 can be reduced to a sufficiently small value. Consequently, the semiconductor device 30 can be manufactured so as to have superior power efficiency.

By reference to FIGS. 3 through 10, the method of manufacturing the semiconductor device 30 according to the first embodiment will now be described.

Figure 3:
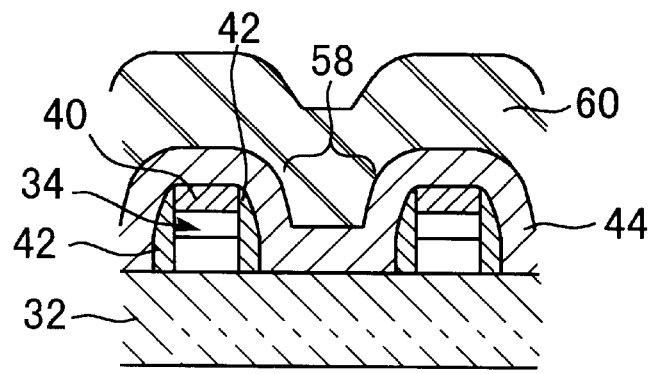
FIGS. 3 through 10 are cross-sectional views for describing a manufacturing method of the semiconductor device shown in FIG. 1.

As shown in FIG. 3, during the manufacturing process of the semiconductor device 30, the transfer gates 34, the oxide film 40, and the wiring frames 42 are formed on the silicon substrate 32 according to known methods.

An interlayer film 44 (oxide film) is formed on the silicon substrate 32 so as to cover the transfer gates 34. The interlayer film 44 is formed by deposition of TEOS over the entire surface of the silicon substrate 32 to a predetermined thickness, so that the thickness of the transfer gate 34 induces an irregularity in the surface of the interlayer film 44. More specifically, a recess 58 is formed in the area of the interlayer film 44 between the transfer gates 34.

BPTEOS; i.e., TEOS containing boron (B) and phosphor (P), has been known as an oxide film suitable for use as an interlayer film. In contrast with an interlayer film formed from TEOS, an interlayer film formed from BPTEOS can be made more smooth. However, forming an interlayer film from BPTEOS involves processing on a per-wafer-basis, i.e., single wafer processing. In contrast, in a case where an interlayer film is formed from TEOS, a plurality of wafers can be processed through batch processing.

The degree of irregularity in the surface of the interlayer film 44 becomes great as the number of wiring layers formed beneath the interlayer film 44 increases. In the first embodiment, only one layer of wiring pattern (i.e., the layer of the transfer gate 34) is formed beneath the interlayer film 44, and hence the irregularity of the interlayer film 44 of the semiconductor device 30 can be limited to a comparative small level even when the interlayer film 44 is formed from TEOS. Thus, the first embodiment can manufacture the semiconductor device 30 at high productivity while suppressing the irregularity of the interlayer film 44.

A polysilicon layer 60 containing impurities at a predetermined content is formed on the interlayer film 44 to a thickness of about 8000 angstroms.

Figure 4:
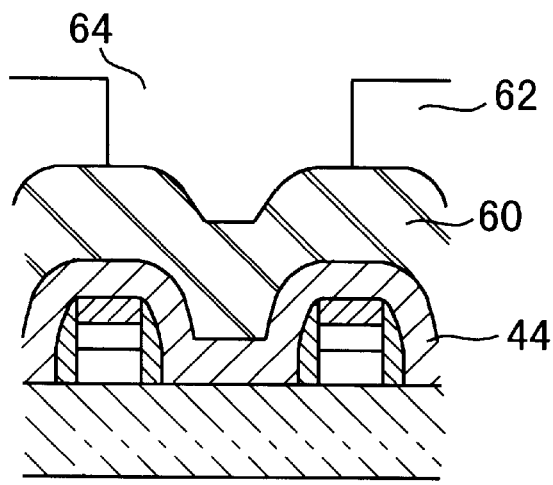

As shown in FIG. 4, a photoresist 62 is formed on the polysilicon layer 60 through photolithography. An opening 64 is formed in the photoresist 62 so as to correspond to the hollow portion of the hollow node 48 (see FIG. 1). The opening 64 can assume a sufficient width both in the direction perpendicular to the transfer gate 34 and in the direction parallel to the transfer gate 34. Therefore, the photoresist 62 can be formed through photolithography employing an inexpensive photolithography apparatus and an inexpensive mask.

Figure 5:
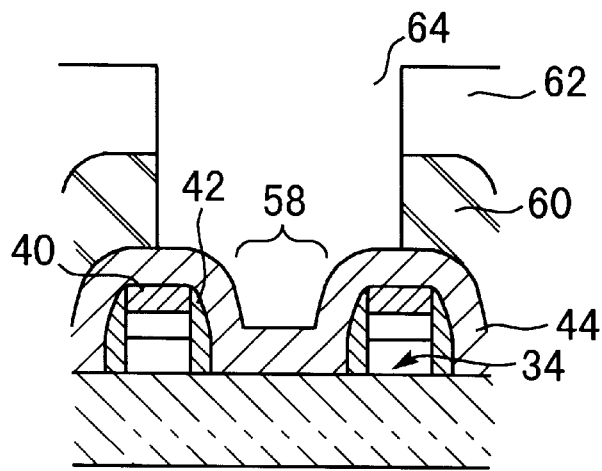

As shown in FIG. 5, the polysilicon layer 60 is etched by an anisotropic etching while the photoresist 62 is used as a mask. Through the anisotropic etching, a predetermined area of the interlayer film 44 (i.e., an area including the recess 58) becomes exposed within the opening 64.

Next, the exposed portion of the interlayer film 44 within the opening 64 is removed by dry-etching, on condition that the oxide film can be removed at a high selectivity in relation to the silicon substrate 32. Further, the dry-etching operation is performed continuously until the interlayer film 44 is removed from the recess 58 and the silicon substrate 32 becomes exposed through the recess 58.

Figure 6:
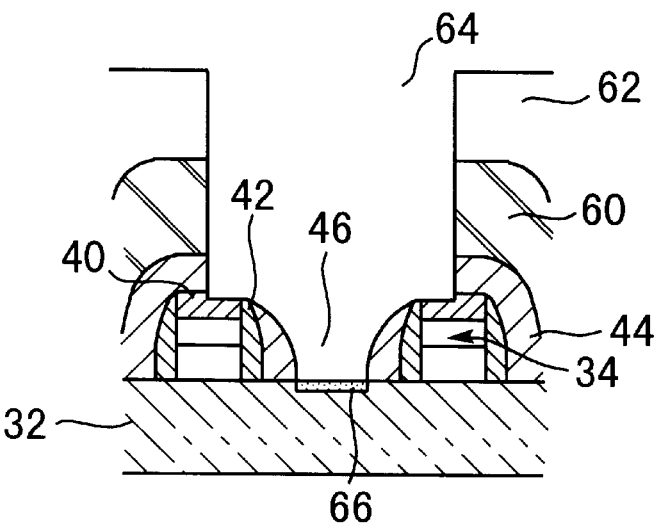

The interlayer film 44 has substantially the same thickness in the recess 58 and at the position where it covers the oxide film 40. Thus, the aforementioned dry etching manufactures the contact hole 46 which permits exposure of the silicon substrate 32 between the transfer gates 34 as well as exposure of a portion of the oxide film 40 and a portion of the wiring frame 42 on the transfer gate 34 (FIG. 6).

As mentioned previously, the semiconductor device 30 according to the first embodiment has a large cross-sectional area at the bottom of the contact hole 46. More specifically, the portion of the contact hole 46 having the smallest diameter assumes a sufficiently large cross-sectional area. To form a contact hole having a small diameter, a high-performance oxide film etcher must be used for forming the contact hole through dry-etching. In contrast, the DRAM structure according to the first embodiment enables sufficient formation of the contact hole 46 through use of an inexpensive oxide film etcher.

Under the manufacturing method according to the first embodiment, CF-based gas is used for the aforementioned dry-etching. As a result of formation of the contact hole 46 through the dry-etching, C ions are implanted into the exposed portion of the silicon substrate 32 at the bottom of the contact hole 46, whereby a damaged layer 66 is formed in the thus-doped area to a thickness of about 100 angstroms (see FIG. 6).

Figure 7:
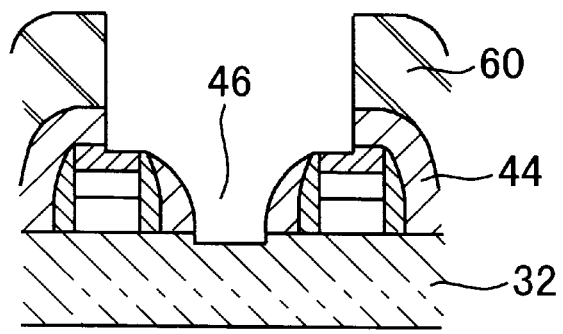

Under the manufacturing method according to the first embodiment, after formation of the contact hole 46, the photoresist 62 is removed, and the damaged layer 66 is removed through a known method (chemical etching employing a down-flow etcher) (FIG. 7).

Figure 8:
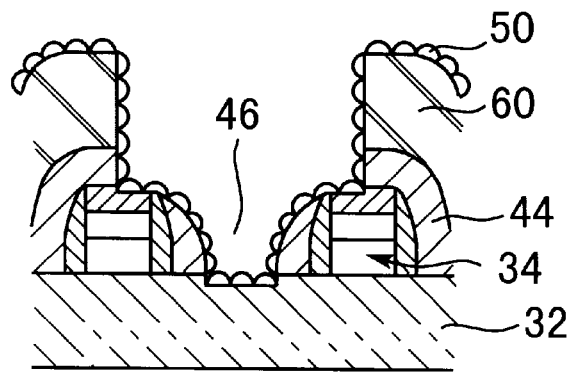

After completion of removal of the damaged layer 66, the conductive layer 50 is formed so as to cover the surface and interior wall of the polysilicon layer 60, the interior wall of the contact hole 46, and the surface of the exposed portion of the silicon substrate 32 within the contact hole 46 (FIG. 8). In the first embodiment, a doped polysilicon layer having a surface roughness of about 1.5 to 2.5, more preferably a surface roughness of about 2.0, is formed as the conductive layer 50 so as to cover the areas set forth. Such a conductive layer 50 can be formed by roughening the wafer including the silicon substrate 32 under appropriate conditions and through use of a single-wafer-type low-pressure CVD apparatus.

Figure 9:
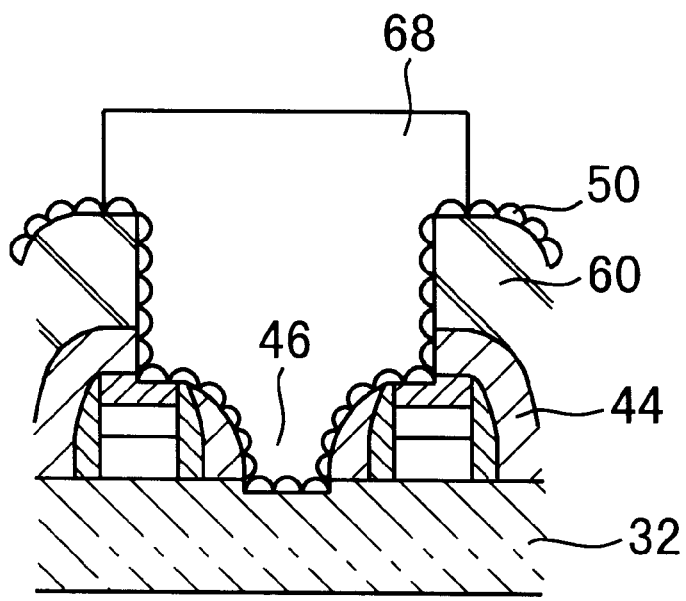

After formation of the conductive layer 50, a photoresist 68 is formed through photolithography so as to cover the interior of the contact hole 46 and predetermined areas of the polysilicon layer 60 (FIG. 9). More specifically, the photoresist 68 is formed so as to cover the area corresponding to the profile of the hollow node 48 (see FIG. 1).

Figure 10:
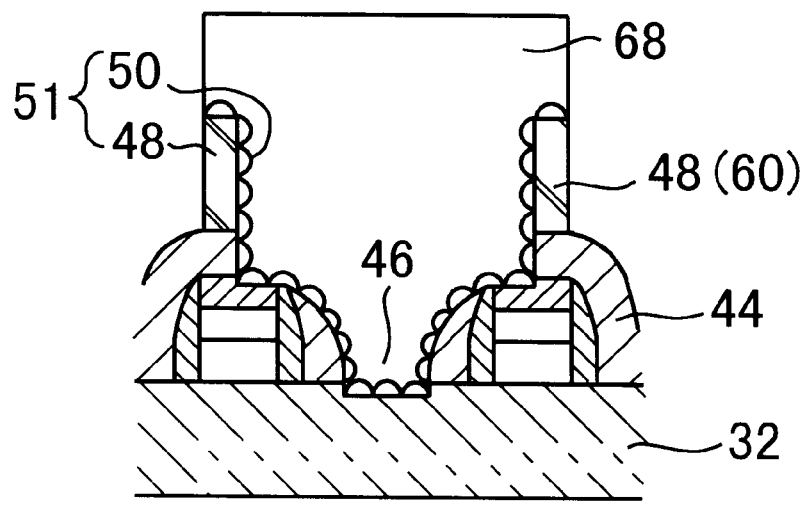

After completion of the foregoing processing, the wafer is etched by an anisotropic dry-etching while the photoresist 68 is used as a mask. An undesired portion of the polysilicon layer 60 is removed through the etching, whereby the exterior wall of the hollow node 48 is formed (FIG. 10). Subsequently, the photoresist 68 is removed to form the structure of a semiconductor device shown in FIG. 1.

The manufacturing method enables formation, through simple processes, of the storage node 51 that can utilize the exterior surface of the hollow node 48 and the roughened conductive layer 50 (i.e., the interior surface of the hollow node 48 and that of the contact hole 46) as part of a capacitor. Such a storage node 51 can ensure sufficient capacitance without necessity for having much height. As mentioned above, the manufacturing method according to the first embodiment enables manufacture of a semiconductor device having a desired structure with improved-yield. That is, the manufacturing method allows high-yield manufacture of the semiconductor device shown in FIG. 1 through use of an inexpensive system and an inexpensive mask.

Other advantages yielded by the manufacturing method according to the first embodiment will be described by reference to FIGS. 11 and 12.

Figure 11:
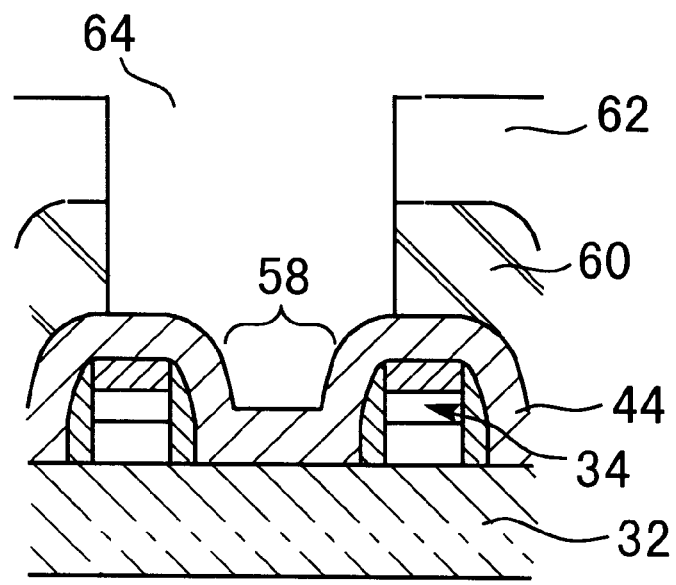
FIGS. 11 and 12 are cross-sectional views for describing advantageous results ensured by the manufacturing method according to the first embodiment of the present invention.
Figure 12:
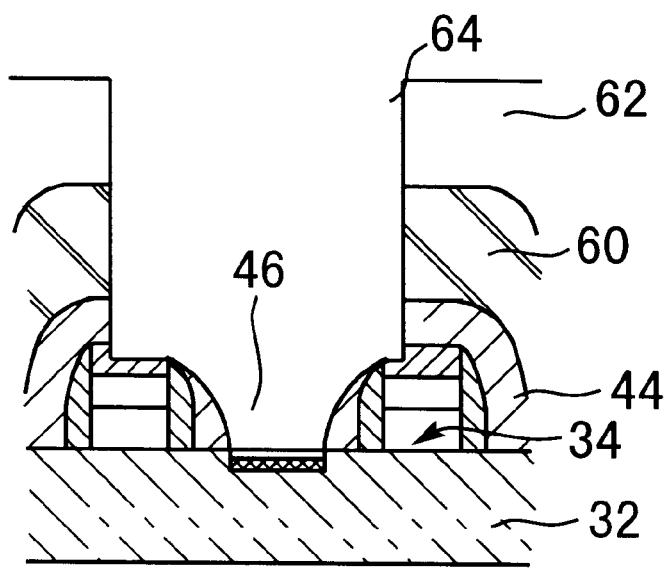

FIGS. 11 and 12 are cross-sectional views corresponding to FIGS. 5 and 6. FIGS. 5 and 6 show that the opening 64 of the photoresist 62 used for forming the contact hole 46 is placed in a correct position; that is, the center of the opening 64 is substantially aligned with the center of the area between the two transfer gates 34. FIGS. 11 and 12 show that the opening 64 of the photoresist 62 is offset from the correct position between the transfer gates 34 in the horizontal direction.

As shown in FIG. 11, when the opening 64 is offset from the correct position, a hollow section is formed in the polysilicon layer 60 in the position offset from the center between the two transfer gates 34. Even in the event of the hollow section of the polysilicon layer 60 being offset from the center, the recess 58 of the interlayer film 44 is correctly formed in the vicinity of the center between the two transfer gates 34.

Under the manufacturing method according to the first embodiment, the opening of the contact hole 46 (i.e., where the silicon substrate 32 becomes exposed) is formed at the bottom of the recess 58. As shown in FIG. 12, even if a positional offset is present between the opening 64 of the photoresist 62 and the hollow section of the polysilicon layer 60, the opening of the contact hole 46 is correctly formed in the position between the transfer gates 34.

As mentioned above, the manufacturing method enables the opening of the contact hole 46 to match a correct position in a self-aligned manner. Accordingly, the manufacturing method according to the first embodiment enables compensation of a tolerance arising from photolithography and ensuring a sufficient area in the opening of the contact hole 46 or the area where the storage node 51 comes into contact with the silicon substrate 32.

Second Embodiment

A semiconductor device according to a second embodiment of the present invention and a manufacturing method thereof will now be described.

As mentioned above, in the semiconductor device 30 according to the first embodiment and the manufacturing method thereof, TEOS is employed as the interlayer film 44. In contrast to the first embodiment, the second embodiment employed BPTEOS as the interlayer film 44.

If the interlayer film 44 is formed from BPTEOS, the surface of the interlayer film 44 can be smoothed through known heat sintering. If the interlayer film 44 can be smoothed, controlling the thickness and dimensions of layers to be formed on the interlayer film 44 may become easier. The semiconductor device and the manufacturing method thereof according to the second embodiment enable improvement in dimensional accuracy of the semiconductor device as compared to that achieved by the semiconductor device and the manufacturing method thereof according to the first embodiment.

Third Embodiment

A semiconductor device according to a third embodiment of the present invention and a manufacturing method thereof will now be described.

As mentioned above, in the semiconductor device 30 according to the first embodiment and the manufacturing method thereof, the conducive layer 50 that covers the interior surface of the hollow node 48 and the interior surface of the contact hole 46 is formed from a roughened doped polysilicon layer. The semiconductor device and the manufacturing method according to the third embodiment are implemented by omission, from the first embodiment, of the process for roughening the surface of the conductive layer 50.

In the first embodiment, the surface of the conductive layer 50 is roughened so as to efficiently increase the surface area of the storage node 51 and to efficiently ensure sufficient capacitance. In contrast to the first embodiment, the third embodiment is effective when enough capacitance can be ensured without a necessity for roughening operations. In the third embodiment, a semiconductor device fulfilling desired features can be produced through a process simpler than that employed in the first embodiment.

Fourth Embodiment

A semiconductor device and a manufacturing method thereof according to a fourth embodiment will now be described.

Under the manufacturing method according to the first embodiment, after completion of etching the polysilicon layer 60 through use of the photoresist 62 (see FIG. 5), the opening is formed in the contact hole 46 while the photoresist 62 is maintained (see FIG. 6). Under the manufacturing method according to the fourth embodiment, after the hollow section of the polysilicon layer 60 has been etched through use of the photoresist 62 in the same manner as the first embodiment, the photoresist 62 is removed. Subsequently, the opening of the contact hole 46 is formed while the polysilicon layer 60 is used as a mask. The contact hole 46 may also be formed by carrying out etching operations while following the above-described procedures.

Fifth Embodiment

A semiconductor device according to a fifth embodiment of the present invention will now be described by reference to FIGS. 13A through 14.

Figures 13A, 13B:
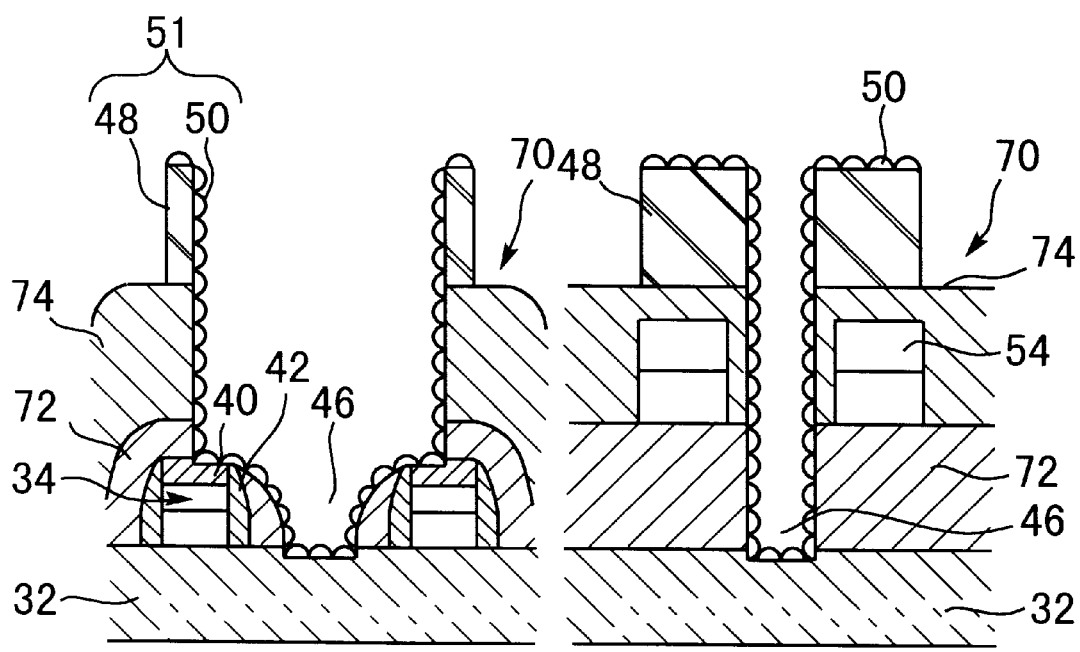
FIGS. 13A and 13B are cross-sectional views showing a semiconductor device according to a fifth embodiment of the present invention.

FIG. 13A is a cross-sectional view of a semiconductor device 70 according to the fifth embodiment taken along the plane perpendicular to the transfer gate 34. FIG. 13B is a cross-sectional view of the semiconductor device 70 taken along the plane parallel to the transfer gate 34. Further, FIG. 14 is a perspective top view showing the structure of the semiconductor device 70.

As shown in FIGS. 13A and 13B, in the semiconductor device 70 according to the fifth embodiment, a first interlayer film 72 is formed from TEOS on the transfer gates 34. On the first interlayer film 72, bit lines 54 are formed from a doped silicon lower layer and a tungsten silicide upper layer. Further, a second interlayer film 74 is formed from TEOS on the bit lines 54.

In the semiconductor device 70 according to the fifth embodiment, the hollow node 48 is formed on the second interlayer film 74, and the contact hole 46 is formed so as to penetrate through the first and second interlayer films 72 and 74 and so as not to interfere with the bit lines 54. The upper and interior surfaces of the hollow node 48, the interior surface of the contact hole 46, and the surface of the exposed portion of the silicon substrate 32 within the contact hole 46 are covered with the conductive layer 50 having a predetermined surface roughness, such as that employed in the first embodiment.

Figure 14:
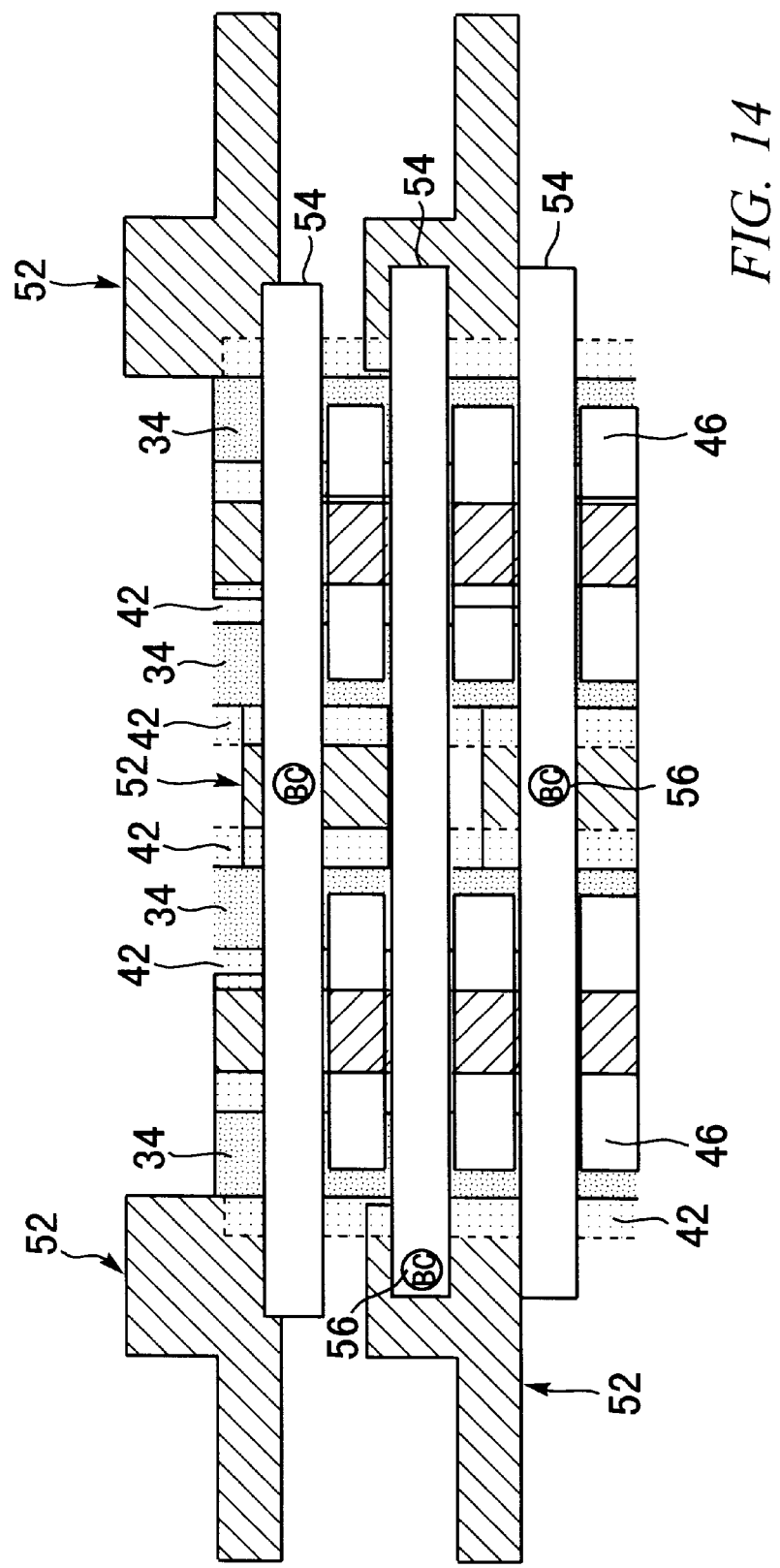
FIG. 14 is a perspective top view showing the structure of the semiconductor device shown in FIG. 13.

In FIG. 14, the semiconductor device 70 is described so that the transfer gates 34 extend in the perpendicular direction. In the semiconductor device 70 according to the fifth embodiment, the bit lines 54 are formed beneath the hollow node 48, as mentioned previously. The contact hole 46 that connects the hollow node 48 to the silicon substrate 32 must be designed so as to interfere with neither the bit lines 54 nor the BC 56.

As shown in FIG. 14, the width of the contact hole 46 in the direction perpendicular to the bit line 54 is slightly smaller than the gap between the bit lines 54 so as to satisfy the foregoing requirements. The contact hole 46 has a sufficient width, in the direction parallel to the bit line 54, such that the contact hole 46 does not interfere with the BC 56. More specifically, the contact hole 46 assumes a width greater than half the pitch of the transfer gates 34 but smaller than about 1.5 times the same (more accurately, smaller than the sum of the gap between the transfer gates 34, the width corresponding to the two transfer gates 34, and the width corresponding to the two wiring frames 42).

As mentioned above, the semiconductor device 70 according to the fifth embodiment has the contact hole 46 which is sufficiently large although slightly smaller than that of the first embodiment. The bottom of such a contact hole 46 assumes a cross-sectional area almost equal to that obtained in the first embodiment. Accordingly, in the semiconductor device 70, the contact area between the storage node 51 and the silicon substrate 32 can assumes substantially the same area as that of the contact area in the first embodiment.

In a case where the bottom of the contact hole 46 has such a large cross-sectional area, it becomes possible: (1) to ensure a large contact area between the storage node 51 and the silicon substrate 32; (2) to reduce the height of the hollow node by utilization of the interior surface of the contact hole 46 as part of a capacitor; and (3) to inexpensively manufacture the contact hole 46. As in the case with the first embodiment, the structure of the semiconductor device according to the fifth embodiment enables inexpensive and high-yield manufacture of a high-integration, superior-power-efficiency semiconductor device.

The method of manufacturing the semiconductor device 70 according to the fifth embodiment will now be described by reference to FIGS. 15A to 23B. FIGS. 15A, 16A, 17A, 18A, 19A, 20A, 21A, 22A, and 23A are cross-sectional views of the semiconductor device 70 taken along the plane perpendicular to the transfer gates 34. FIGS. 15B, 16B, 17B, 18B, 19B, 20B, 21B, 22B, and 23B are cross-sectional views of the semiconductor device 70 taken along the plane perpendicular to the bit lines 54.

As shown in FIG. 15A, under the manufacturing method according to the fifth embodiment, after the transfer gates 34, the oxide film 40, and the wiring frames 42 have been formed on the silicon substrate 32, the first interlayer film 72 is formed so as to cover them. The first interlayer film 72 is formed by depositing TEOS over the entire surface of the silicon substrate 32 to a predetermined thickness. The recess 58 due to the thickness of the transfer gates 34 is formed on the surface of the first interlayer film 72. On the first interlayer film 72 are formed the bit lines 54 (FIG. 15B).

As shown in FIGS. 16A and 16B, the second interlayer film 74 is formed on the bit lines 54 by depositing TEOS over the entire surface of the first interlayer film 72 to a predetermined thickness. The recess 58 is reflected in the surface of the second interlayer film 72. On the second interlayer film 74 is formed the polysilicon layer 60 to a thickness of about 8000 angstroms.

Figure 17A:
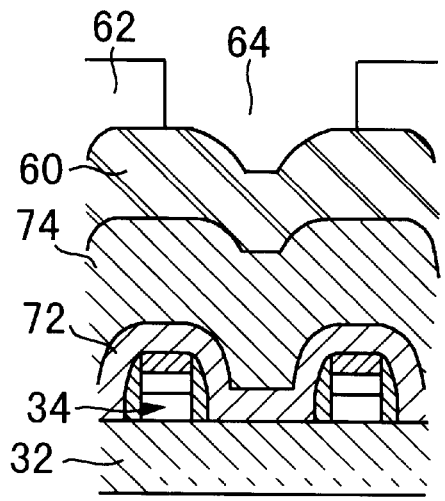
Figure 17B:
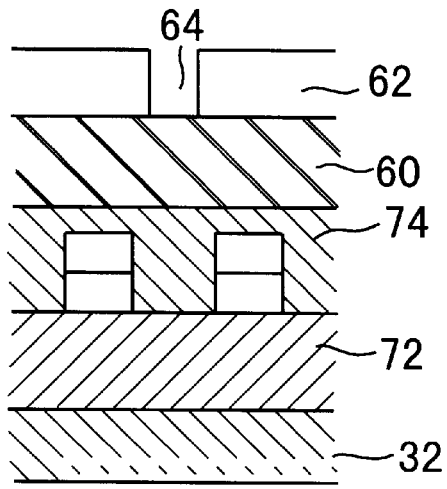

As shown in FIGS. 17A and 17B, the photoresist 62 is formed on the polysilicon layer 60 through photolithography. The opening 64 that corresponds to the hollow section of the hollow node 48 (see FIGS. 13A and 13B) is formed in the photoresist 62. The width of the opening 64 may assume a sufficient width in either the direction perpendicular to the transfer gates 34 or the direction parallel to the transfer gates 34. Thus, the photoresist 62 can be formed through photolithography employing an inexpensive apparatus and an inexpensive mask.

Figure 18A:
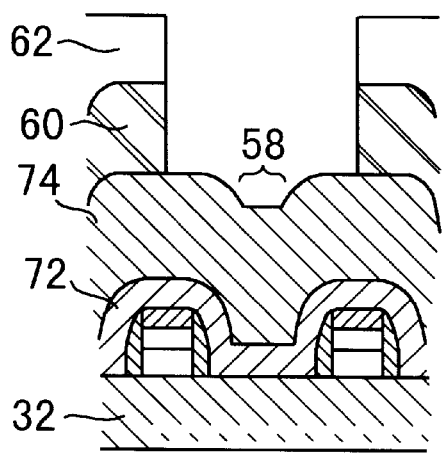
Figure 18B:
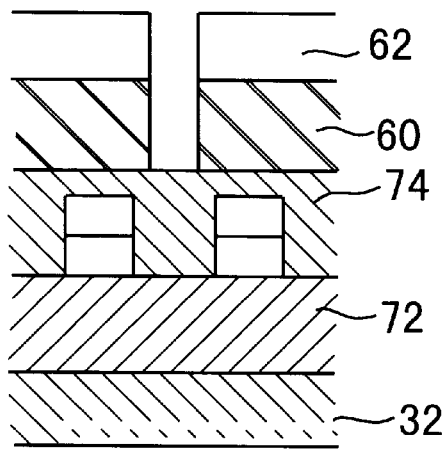
Figure 23A:
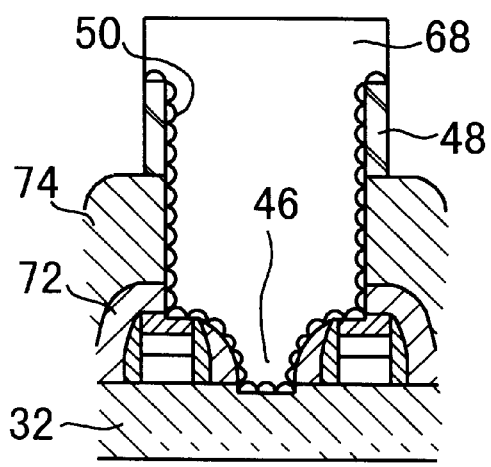
Figure 23B:
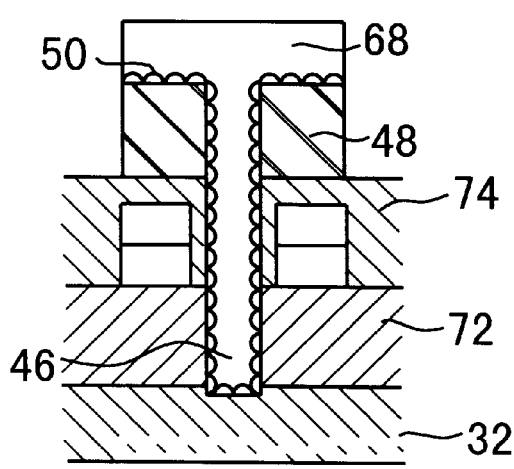
Figure 24:
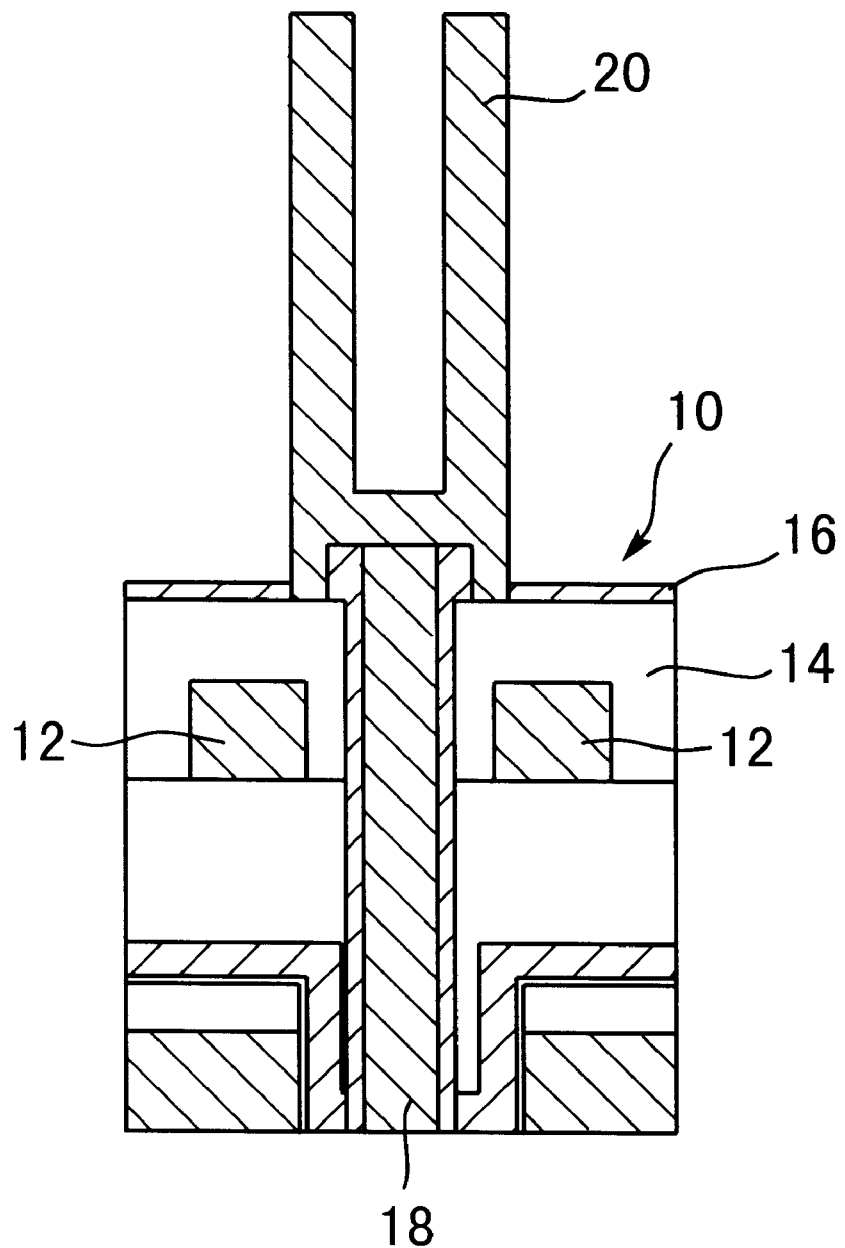
FIG. 24 is a cross-sectional view showing a former semiconductor device.
Figure 25:
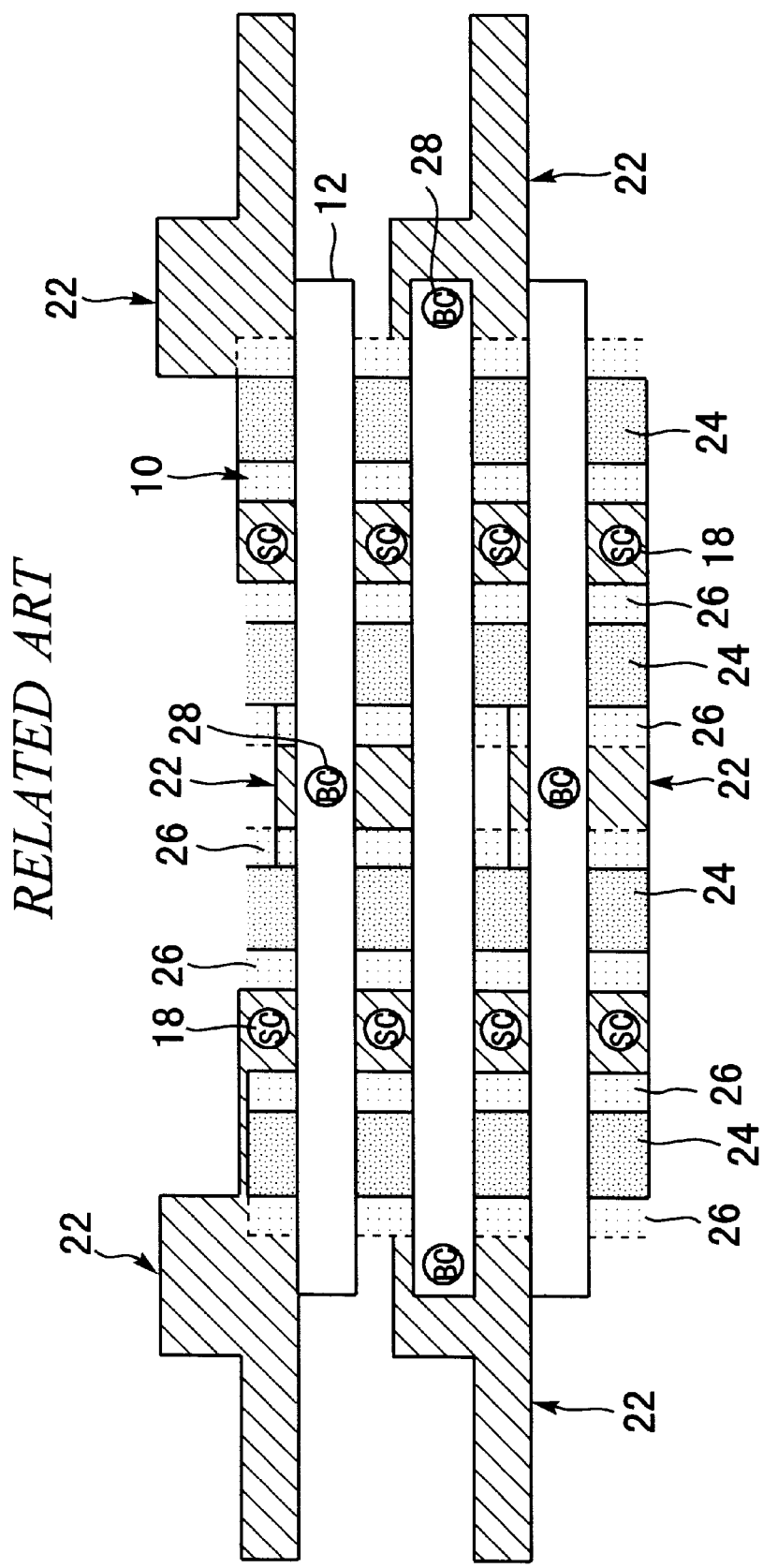
FIG. 25 is a perspective top view showing the structure of the former semiconductor device.

As shown in FIGS. 18A and 18B, the polysilicon layer 60 is etched by an anisotropic etching while the photoresist 62 is used as a mask. As a result of the anisotropic etching, a predetermined area of the second interlayer film 74 (i.e., the area including the recess 58) becomes exposed within the opening 64.

Next, the exposed portion of the second interlayer film 74 within the opening 64 and the first interlayer film 72 beneath the thus-exposed portion are removed through dry-etching. The contact hole 46 which permits exposure of the silicon substrate 32 is formed in a substantially intermediate position between the transfer gates 34, in a self-aligned manner (FIGS. 19A and 19B).

As mentioned previously, in the semiconductor device 70 according to the fifth embodiment, the bottom of the contact hole 46 has a large cross-sectional area. Thus, the opening of the contact hole 46 can be formed through use of an inexpensive oxide film etcher as in the case with the first embodiment.

The formation of the contact hole 46 is followed by removal of the photoresist 62 and removal of the damaged layer 66 (see FIGS. 20A and 20B).

The conductive layer 50 is formed so as to cover the surface and interior wall of the polysilicon layer 60, the interior wall of the contact hole 46, and the surface of the exposed portion of the silicon substrate 32 within the contact hole 46 (FIGS. 21A and 21B). As in the case with the first embodiment, the conductive layer 50 is formed through roughening by use of a single wafer type low-pressure CVD apparatus.

Next, the photoresist 68 is formed so as to cover the interior of the contact hole 46 and predetermined areas of the polysilicon layer 60. More specifically, as shown in FIGS. 22A and 22B, the photoresist 68 is formed so as to cover the area corresponding to the profile of the hollow node 48 (see FIGS. 13A and 13B).

After completion of the foregoing processing, the wafer is dry-etched by an anisotropic etching while the photoresist 68 is used as a mask. An undesired portion of the polysilicon layer 60 is removed through the etching, whereby exterior outer wall of the hollow node 48 is formed (FIGS. 22A and 22B). Subsequently, the photoresist 68 is removed to form the structure of a semiconductor device shown in FIGS. 13A and 13B.

As in the case with the manufacturing method according to the first embodiment, the manufacturing method enables formation, through simple processes, of the storage node 51 having a structure which prevents falling and is suitable for ensuring sufficient capacitance. Accordingly, the fifth embodiment enables high-yield manufacture of the semiconductor shown in FIGS. 13A and 13B through use of an inexpensive apparatus and an inexpensive mask.

Sixth Embodiment

A semiconductor device and a manufacturing method thereof according to a sixth embodiment of the present invention will now be described.

As mentioned above, in the fifth embodiment, TEOS is employed for the first and second interlayer films 72 and 74. The semiconductor device according to the sixth embodiment is implemented by employing BPTEOS as the first and second interlayer films 72 and 74.

If the first and second interlayer films 72 and 74 are formed from BPTEOS, the surface of each of these films 72 and 74 can be smoothed through known heat sintering. So long as the first and second interlayer films 72 and 74 can be smoothed, controlling the thickness and dimensions of layers to be formed on the first and second interlayer films 72 and 74 becomes easier. Thus, the sixth embodiment enable improvement in the dimensional accuracy of the semiconductor device as compared to that yielded by the fifth embodiment.

Seventh Embodiment

A semiconductor device and a manufacturing method thereof according to a seventh embodiment of the present invention will now be described.

As mentioned above, in the fifth embodiment, the conductive layer 50 is formed from a roughened doped polysilicon layer so as to cover the interior surface of the hollow node 48 and the interior surface of the contact hole 46. The seventh embodiment is implemented by omission, from the fifth embodiment, of the process for roughening the surface of the conductive layer 50. According to the seventh embodiment, a semiconductor device fulfilling desired features can be manufactured through a process simpler than that employed in the fifth embodiment by omitting the roughening process.

Eighth Embodiment

A method of manufacturing a semiconductor device according to an eighth embodiment of the present invention will now be described.

Under the manufacturing method according to the fifth embodiment, after the polysilicon layer 60 has been etched through use of the photoresist 62 (see FIGS. 18A and 18B), the opening of the contact hole 46 is formed while the photoresist 62 is maintained (see FIGS. 19A and 19B). The manufacturing method according to the eighth embodiment may be implemented by etching the hollow section of the polysilicon layer 60 through use of the photoresist 62 in the same manner as the fifth embodiment, by removing the photoresist 62, and by forming an opening in the contact hole 46 while the polysilicon layer 60 is taken as a mask. The contact hole 46 can also be appropriately opened through the above-described etching processes.

The major benefits of the present invention described above are summarized as follows:

According to a first aspect of the present invention, the wall surface of a contact hole covered with a conductive layer as well as the wall surface of a hollow node can be used as part of a capacitor. The structure of the semiconductor device according to the present invention ensures sufficient capacitance without a necessity for setting the height of the hollow node to a considerably large value. Accordingly, the semiconductor device according to the present invention can be manufactured at a high-yield.

According to a second aspect of the present invention, a second wiring pattern is formed on the hollow node. By means of such a structure, the hollow node and the contact hole can be formed without consideration of interference with the second wiring pattern. More specifically, the hollow node and the contact hole can also be imparted with a large cross-sectional area. So long as the hollow node and the contact hole can be imparted with a large cross-sectional area, electrical resistance between the hollow node, the contact hole, and the silicon substrate can be reduced while the hollow node and the contact hole can be formed through use of an inexpensive apparatus and an inexpensive mask. Thus, the present invention enables a high-integration, superior-power-efficiency, and an inexpensive manufacture.

According to a third aspect of the present invention, the hollow node can be imparted with a width greater than the gap between the second wiring patterns. For this reason, according to the present invention, even in a case where a high degree of integration is required, the hollow node assumes a comparatively large cross-sectional area.

According to a fourth aspect of the present invention, the hollow node can be formed on the second wiring pattern. Accordingly, the height of the hollow node can be freely designed.

According to a fifth aspect of the present invention, the hollow node can be imparted with a wide width within the width occupied by two adjacent first wiring patterns (including the width occupied by wiring frames of the wiring patterns). The structure of the semiconductor device according to the present invention enables a large cross-sectional area to be imparted to the hollow node while preventing interference between the hollow node and the contact for the second wiring pattern.

According to a sixth aspect of the present invention, since the conductive layer covering the interior surface of the contact hole is roughened, the conductive layer can be ensured of having a large surface area. Thus, the present invention efficiently ensures high capacitance within a small occupied area.

According to a seventh aspect of the present invention, TEOS is used for an interlayer film, and hence the interlayer film can be formed through batch processing. Accordingly, the semiconductor device according to the present invention can be manufactured at a high yield.

According to an eighth aspect of the present invention, BPTEOS is used for an interlayer film. So long as the interlayer film is formed from BPTEOS, irregularities due to the first wiring patterns can be smoothed. Therefore, the semiconductor device according to the present invention can be manufactured with superior dimensional accuracy.

According to a ninth aspect of the present invention, the semiconductor device can be formed in a structure which enables utilization of the wall surface of the contact hole as part of a capacitor. The present invention enables high-yield manufacture of a semiconductor device whose memory cells have sufficient capacitance.

According to a tenth aspect of the present invention, a second wiring pattern can be formed on the hollow node. Therefore, according to the present invention, the hollow node and the contact hole can be imparted with a large cross-sectional area without consideration of interference with the second wiring pattern. The present invention enables inexpensive manufacture of a high-integration, superior-power-efficiency semiconductor device.

According to an eleventh aspect of the present invention, a hollow node having a width greater than the gap between the second wiring patterns can be formed. Therefore, the present invention enables manufacture of a high-integration semiconductor device whose hollow node has a large cross-sectional area.

According to a twelfth aspect of the present invention, a hollow node can be formed on the second wiring pattern. Thus, the present invention enables manufacture of a hollow node such that its height can be freely designed.

According to a thirteenth aspect of the present invention, a contact hole is formed by removal of the interlayer film from the recess formed in the position between the first wiring patterns. The manufacturing method according to the present invention enables formation of a contact hole in a self-aligned manner regardless of an offset produced during photolithography.

According to a fourteenth aspect of the present invention, a hollow node having a large width can be formed so as to become smaller than the width occupied by two adjacent first wiring patterns (including the width occupied by the wiring frames of the wiring patterns). The present invention enables formation of a large hollow node while interference between the hollow node and the contact for the second wiring patterns is prevented.

According to a fifteenth aspect of the present invention, the interior surface of the hollow node, the interior surface of the contact hole, and the bottom of the contact hole are roughened, thereby enabling formation of a conductive layer having a predetermined surface roughness. The present invention enables efficient manufacture of memory cells having high capacitance through simple processes.

Further, the present invention is not limited to these embodiments, but variations and modifications may be made without departing from the scope of the present invention.

The entire disclosure of Japanese Patent Application No. Hei 11-9632 filed on Jan. 18, 1999 including specification, claims, drawings and summary are incorporated herein by reference in its entirety.

What is claimed is:

1. A semiconductor device comprising:
   a plurality of first wiring patterns having side surfaces formed on a silicon substrate;
   an interlayer formed on the silicon substrate, the interlayer having an upper surface and covering the first wiring patterns, the interlayer further having a contact hole penetrating the upper surface to expose the surface of the silicon substrate without exposing the first wiring patterns, the contact hole having interior surfaces;
   a hollow node comprising a conductive material and having a lower surface on the upper surface of the interlayer, the hollow node having interior surfaces and surrounding the contact hole; and
   a conductive layer covering the interior surfaces of the hollow node and extending below the hollow node directly covering the interior surfaces of the contact hole made of the interlayer.

2. The semiconductor device according to claim 1, wherein a plurality of second wiring patterns insulated from the hollow node are provided above said hollow node.

3. The semiconductor device according to claim 2, wherein there is a gap between the second wiring patterns and the hollow node has a width greater than the gap between the second wiring patterns.

4. The semiconductor device according to claim 1, wherein the interlayer includes a first interlayer film and a second interlayer film; and the semiconductor device further comprises a plurality of second wiring patterns formed at the position between the first and second interlayer films so as not to interfere with the contact hole.

5. The semiconductor device according to claim 1, wherein the surface of the conductive layer covering the interior surface of the contact hole is roughened.

6. The semiconductor device according to claim 1, wherein the interlayer film is a dielectric layer formed from TEOS containing neither phosphorous nor boron.

7. The semiconductor device according to claim 1, wherein the interlayer film is a dielectric layer formed from BPTEOS containing phosphorous and boron.

8. The semiconductor device according to claim 1, further comprising:
   wiring frames which cover the respective side surfaces of the first wiring pattern a predetermined thickness, and
   a contact for a second wiring pattern which establishes electrical connection between the silicon substrate and the second wiring patterns, in the area between the wiring frames,
   wherein width of the hollow node is greater than half the pitch of the first wiring patterns and is smaller than the sum of:
   (a) a gap of the first wiring patterns,
   (b) twice the width of the first wiring patterns, and
   (c) twice the width of the wiring frame.

* * * * *